United States Patent
Yeh et al.

(10) Patent No.: US 7,763,517 B2
(45) Date of Patent: Jul. 27, 2010

(54) METHOD OF FORMING NON-VOLATILE MEMORY CELL

(75) Inventors: Chin-Tsan Yeh, Hsinchu (TW);
Chih-Hsien Lo, Hsinchu County (TW);
Chin-Ta Su, Yunlin County (TW);
Kuang-Chao Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 131 days.

(21) Appl. No.: 11/673,606

(22) Filed: Feb. 12, 2007

(65) Prior Publication Data

US 2008/0194071 A1 Aug. 14, 2008

(51) Int. Cl.
*H01L 21/336* (2006.01)

(52) U.S. Cl. ............... 438/287; 438/275; 257/E21.228

(58) Field of Classification Search ............... 438/279, 438/195, 287, 275, 283; 257/411
See application file for complete search history.

(56) References Cited

U.S. PATENT DOCUMENTS

| | | | |
|---|---|---|---|
| 6,194,784 B1 * | 2/2001 | Parat et al. ................... | 257/774 |
| 6,338,744 B1 * | 1/2002 | Tateyama et al. ............. | 51/308 |
| 6,830,504 B1 * | 12/2004 | Chen et al. ................... | 451/57 |
| 6,969,658 B2 * | 11/2005 | Cho et al. .................... | 438/275 |
| 7,244,642 B2 * | 7/2007 | Vitale et al. .................. | 438/197 |
| 2004/0209429 A1 * | 10/2004 | Lin et al. ..................... | 438/279 |
| 2007/0004187 A1 * | 1/2007 | Wei .............................. | 438/586 |
| 2007/0057324 A1 * | 3/2007 | Tews et al. ................... | 257/347 |
| 2008/0096331 A1 * | 4/2008 | Chen et al. ................... | 438/151 |

FOREIGN PATENT DOCUMENTS

CN 1652308 8/2005

OTHER PUBLICATIONS

English abstract of CN1652308.
* cited by examiner

*Primary Examiner*—Phat X Cao
*Assistant Examiner*—Nga Doan
(74) *Attorney, Agent, or Firm*—Thomas, Kayden, Horstemeyer & Risley

(57) ABSTRACT

A method of forming a non-volatile memory cell is provided. The method comprises: (a) providing a substrate; (b) forming a stacking structure on the substrate, the stacking structure at least comprising an oxide-nitride-oxide layer (ONO layer) and a polysilicon layer thereon; (c) patterning the stacking structure to form a plurality of separated stacking units, each two stacking units having an aperture therebetween; (d) forming a source region and a drain region buried in the substrate at two sides of the each stacking unit; (e) forming an oxide layer in the aperture and over the stacking units; and (f) performing a chemical mechanical polishing (CMP) process to remove the oxide layer over the stacking units and outside the aperture.

11 Claims, 3 Drawing Sheets

METHOD OF FORMING NON-VOLATILE MEMORY CELL

BACKGROUND OF THE INVENTION

1. Field of the Invention

The invention relates in general to a method of forming a non-volatile memory cell, and more particularly to a method of forming a non-volatile memory cell in combination with a chemical mechanical polishing process.

2. Description of the Related Art

The memory devices for non-volatile storage of information, such as read only memory (ROM), programmable read only memory (PROM), erasable programmable read only memory (EPROM), and other advanced memory devices, are currently used in the worldwide industries. The other advanced memory devices that involve more complex processing and testing procedures include electrically erasable programmable read only memory (EEPROM), and flash EEPROM. These advanced memory devices can accomplish the tasks that ROM can't do. For example, using EEPROM devices in circuitry permits in-circuit erasing and reprogramming of the device.

The main characteristic of nitride trap memory is dual bit cells having multiple threshold voltage levels, where every two threshold voltage levels together store a different bit. Others store one bit on either side of the cell. The conventional structures and fabricating methods of nitride trap memory cell are described in a lot of articles and references.

Referring to FIG. 1A~1C, cross-sectional view of diagrams illustrating a conventional method for forming a nitride trap memory. The buried diffusion oxide (BD oxide) 19 is deposited over the substrate 11, on which two gate structures 13 have already formed, as shown in FIG. 1A. These gate structures are covered by a layer 16 of silicon nitride ($Si_3N_4$). The thickness of the blocking layer 16 is 1600 angstroms or more, Next, The whole device is dipped into Hydrofluoric acid (HF) to partially etch the BD oxide away, as shown in FIG. 1B. The BD oxide layer 19b deposited between two gate structures 13 becomes lower than before, and a little peak 19a consisting of BD oxide 19 remains on the silicon nitride layer 16. It is noted that the interface between the BD oxide layer 19b and the gate structure 13 is also exposed to hydrofluoric acid. Weak interface may generate in this step.

Afterward, silicon nitride layer 16 is etched away and the BD oxide peak 19a thereon is also took away, so-called a lift-off process, as shown in FIG. 1C. The substrate is treated with phosphoric acid ($H_3PO_4$) of strong causticity for almost one hour, and then the silicon nitride layer 16 would be lift off completely. Phosphoric acid may flow to the substrate 11 along the cracks 20 and etch the substrate 11. Chemical damage on the substrate seriously reduces yield random single bit (RSB) failure rate. Besides, the surface of the BD oxide layer 19c is cupped, and it has to be polished for the following procedures.

SUMMARY OF THE INVENTION

The invention is directed to a method of forming a non-volatile memory cell, in which the oxide layer between memory cells is planarized by a chemical mechanical polishing process, rather than etched by corrosive acid. Reduced chemical damage on the memory cell contributes to improved random single bit (RSB) failure rate, and it therefore increases the yield.

According to the present invention, a method of forming a non-volatile memory cell is provided. The method comprises: (a) providing a substrate; (b) forming a stacking structure on the substrate, the stacking structure at least comprising an oxide-nitride-oxide layer (ONO layer) and a polysilicon layer thereon; (c) patterning the stacking structure to form a plurality of separated stacking units, each two stacking units having an aperture therebetween; (d) forming a source region and a drain region buried in the substrate at two sides of the each stacking unit; (e) forming an oxide layer in the aperture and over the stacking units; and (f) performing a chemical mechanical polishing (CMP) process to remove the oxide layer over the stacking units and outside the aperture.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
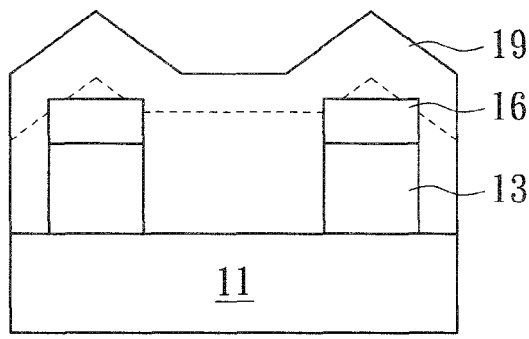
FIGS. 1A~1C are cross-sectional view of diagrams illustrating a conventional method for forming a nitride trap memory.
Figure 1B:
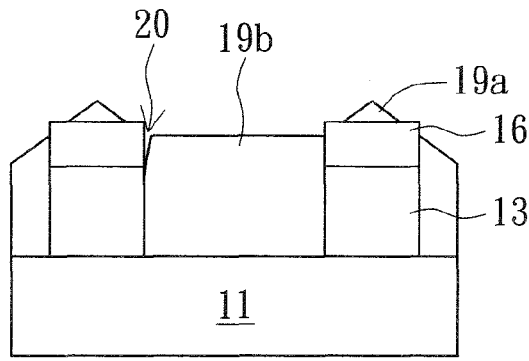
Figure 1C:
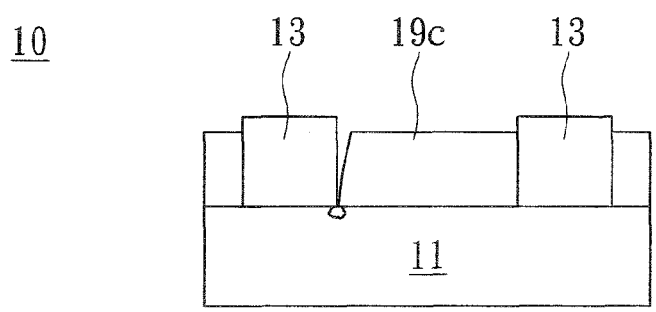
Figure 2A:
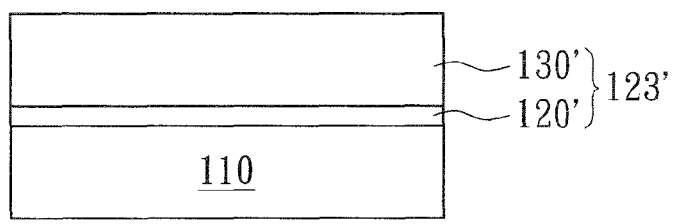
FIGS. 2A~2D schematically illustrate cross-sectional views of diagrams illustrating a method of forming a non-volatile memory cell of the invention according to the first embodiment.

Referring to FIGS. 2A~2D, cross-sectional view of diagrams illustrating a method of forming a non-volatile memory cell of the invention according to the first embodiment. The non-volatile memory for example, is read only memory (ROM), programmable read only memory (PROM), erasable programmable read only memory (EPROM), electrically erasable programmable read only memory (EEPROM), flash EEPROM, or nitride trap memory. The method of forming a non-volatile memory cell including following steps. Firstly, a substrate 110 is provided, and a stacking structure 123' is then formed on the substrate, as shown in FIG. 2A. The stacking structure 123' at least including an oxide-nitride-oxide (ONO) layer 120' and a polysilicon layer 130'. The ONO layer 120' is formed on the substrate 110, and the polysilicon layer 130' is then formed on the ONO layer 120'. The ONO layer 120' includes a top oxide layer, a nitride layer, and a bottom oxide layer. The top and the bottom oxide layer are thicker than 20 Å to avoid any direct tunneling.

Figure 2B:
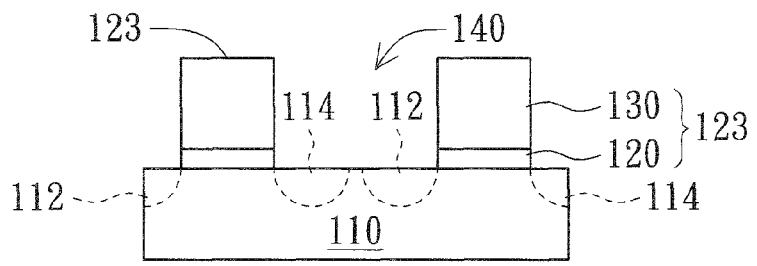

Then, the stacking structure 123' is patterned to form numerous stacking units 123 isolated from each other, as shown in FIG. 2B. Every two separated stacking units 123 have an aperture 140 to separate them. Next, the substrate 110 exposed through the aperture 140 undergoes two implantation processes, so that a two doped region, i.e. source region 112 and drain region, are formed at two sides of each stacking unit 123 and buried in the substrate 110, as shown in FIG. 2B.

Figure 2C:
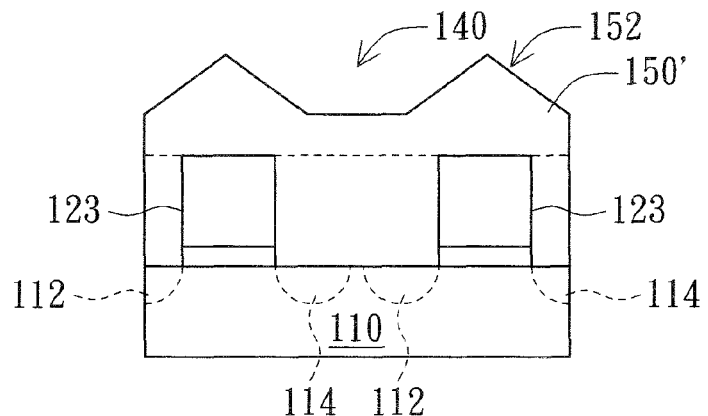
Figure 2C:
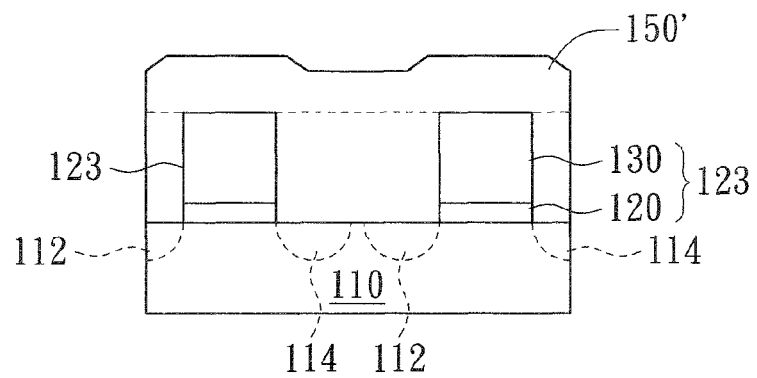

Afterward, an oxide layer 150' is deposited over the stacking units 123, as shown in FIG. 2C. The oxide layer 150' preferably includes High Density Plasma Oxide (HDP), Tetraethoxysilane (TEOS) or Boro Phospho Silicate Glass (BPSG). As shown in FIG. 2C, the oxide layer 150' not only fills into the aperture 140 but also is deposited over the stacking units 123. The peaks 152, which are the oxide layer 150' stacked over the stacking units 123, causes an uneven surface of the oxide layer 150'.

Figure 2D:
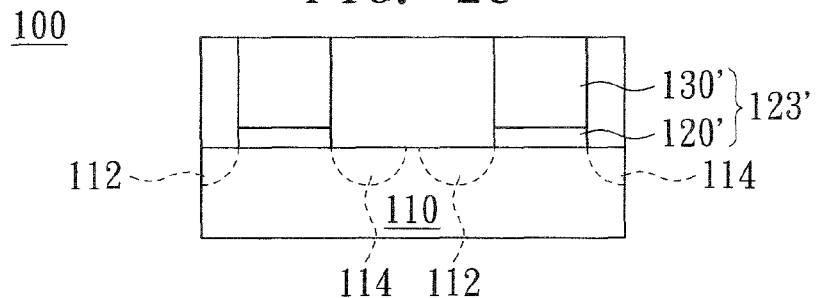

Finally, a chemical mechanical polishing (CMP) process is performed to remove the oxide layer 150a over the stacking units 123 and outside the aperture 140, as shown in FIG. 2D. The CMP process is an abrasive technique that typically includes the use of a combination of chemical agents, i.e. slurry, and mechanical agents, i.e. polishing pad, to remove material from a surface of a semiconductor device. The slurry oxidizes the material of the top layer, and the polishing pad mechanically removes the oxides from the surface of the semiconductor device. One critical point in CMP process is how to determine whether the polishing process is complete or not. If an excessive amount of material is removed (over-polishing), the memory cell 100 is rendered unusable. If an insufficient amount of material is removed (underpolishing), the memory cell 100 must be reloaded into the CMP apparatus for further processing.

The CMP process is applied from the top side of the memory cell 100. After the peaks 152 has removed away as shown in FIG. 2C', the CMP process will continue until the polysilicon layer 130 has no longer embedded in the oxide layer 150'. As a result, both the oxide layer 150' and polysilicon layer 130 appear on the top surface of the non-volatile memory cell 100 of the invention. In other words, the oxide layer 150' is the layer directly contact with the polishing apparatus or the only material to react with the slurry at beginning of the CMP process, but the polysilicon layer 130 and the oxide layer 150 both on the top surface and react with the slurry at the end of the CMP process.

In the present embodiment, the endpoint of the CMP process can be determined by a real-time monitor or a high selectivity slurry. The real-time monitor, such as in-situ-rate-monitor (ISRM), equipped in the polishing apparatus catches the endpoint of the CMP process by detecting the reflectivity of underlying surface, since the reflectivity of the oxide layer 150' is distinguishable from that of the polysilicon layer 130. Once the associated change in reflectivity of the memory cell is detected, the CMP process should be stop. In addition, another effective approach to detect the endpoint of the CMP process is base on high-selectivity slurry. The selectivity of the slurry is defined as the ratio of the material removal rate (RR) of one material, i.e. oxide, to that of another material, i.e. polysilicon. By using the slurry providing selectivity for the oxide layer to the polysilicon layer, the removal rate of the oxide is faster than that of the polysilicon. Thus, the removal rate will be slow down when it comes to the polysilicon. Once the associated change in removal rate is detected, the CMP process should be stop. Preferably, the slurry providing selectivity for the oxide layer to the polysilicon layer of the present embodiment is a ceria ($CeO_2$) based slurry. According to the experimental result, the removal rate of the HDP oxide by the ceria based slurry is 2914 A/min, and the removal rate of the polysilicon by the ceria based slurry is only 360 A/min. It proves that ceria based slurry is the slurry providing high selectivity for the oxide layer to the polysilicon layer. Ceria based slurry also shows high selectivity of polysilicon to other oxide, such as TEOS or BPSG.

The oxide layer of the presented embodiment is flatter or evener than that of the conventional non-volatile memory cell. It is noteworthy that no acid or etchant will be used in the present embodiment. Reduced chemical damage on the memory cell contributes to improved random single bit (RSB) failure rate, and it therefore increases the yield.

Further, two kinds of slurries could be respectively applied during the CMP process to improve the polishing efficiency. At first, one slurry providing no selectivity but having high removal rate of the oxide, such as silica based slurry, is used for quickly abrading the oxide layer. Until the oxide layer 150' forms a substantially flat surface as shown in FIG. 2C', another slurry providing selectivity for the oxide layer and the polysilicon layer is then be applied to catch the endpoint of the CMP process. By doing so, the consuming slurry would be decreased and the polishing time could be saved.

Second Embodiment

The method of the present embodiment differs from that of the first embodiment in the stopping layer on the top of the stacking structure during the polishing process. The same piece remains numerically labeled the same in the following drawings.

Figure 3A:
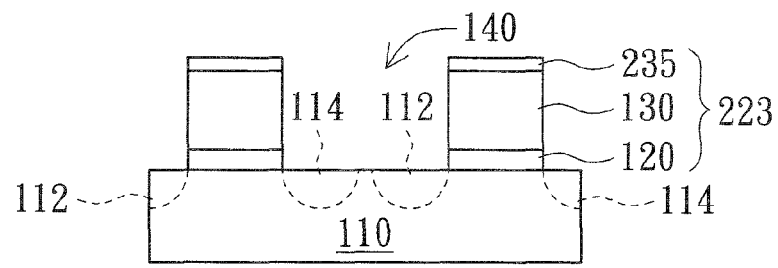
FIGS. 3A~3D schematically illustrating cross sectional views illustrating a method of forming a non-volatile memory cell according to the second embodiment of the invention.

Referring to FIGS. 3A~3D, cross sectional views illustrating a method of forming a non-volatile memory cell according to the second embodiment of the invention. Firstly, numerous stacking units 223 are formed on the substrate 110, as shown in FIG. 3A. Besides the ONO layer 120 and the polysilicon layer 130, the stacking units 223 further includes a stopping layer 235 formed on the polysilicon layer 130. Two implantation processes are then be performed to form the source region 112 and drain region 114. The stopping layer 235 is located on the top of the stacking units and blocks accelerating ions during the implantation, so that it prevents the polysilicon layer 130 from being doped. The stopping layer 235 also functions in the following CMP process, and the detail will be discussed later. The stopping layer preferably comprises silicon nitride ($Si_3N_4$) or super silicon rich oxide (SSRO). The thickness of silicon nitride is preferably less than 1000 angstroms. Further, the stopping layer made of SSRO is able to be much thinner, such as less than 300 angstroms.

Figure 3B:
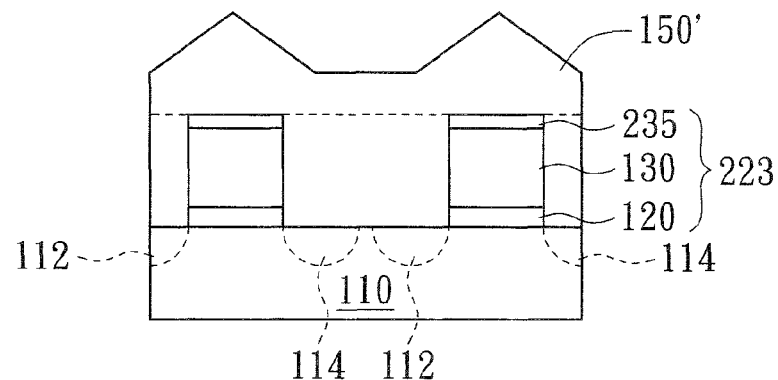
Figure 3C:
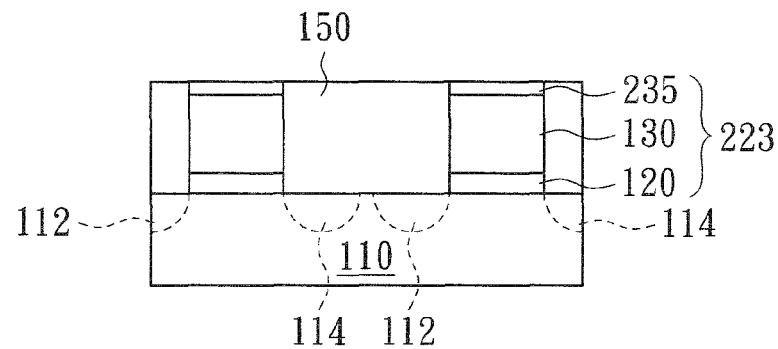

After ion implantation, the oxide layer 150' is formed over the substrate, and it fills in the aperture 140 and also stacked over the stacking units 223, as shown in FIG. 3B. Next, the oxide layer 150' outside the aperture and over the stacking units 223 is removed by the CMP process, as shown in FIG. 3C. In the present embodiment, it is the oxide layer 150' and the stopping layer 235 that on the top surface of the non-volatile memory cell at the end of the CMP process. Accordingly, the endpoint of the CMP process can also be determined by a real-time monitor or a high selectivity slurry. The reflectivity of the stopping layer 235 also differs from that of the oxide layer 150'. The slurry providing selectivity of oxide to the stopping layer is preferably ceria based slurry.

Figure 3D:
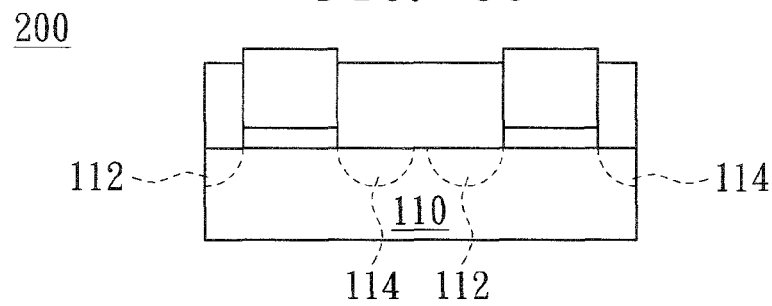

Finally, the stopping layer 235 is removed by an etchant, such that the non-volatile memory cell is completed, as shown in FIG. 3D. The etchant is determined by the material of the stopping layer 235. If the stopping layer 235 comprises silicon nitride ($Si_3N_4$), the etchant used for removing the silicon nitride will comprises hot phosphoric acid ($H_3PO_4$). If the stopping layer 235 comprises super silicon rich oxide (SSRO), the etchant used for removing the super silicon rich oxide will comprises hydrofluoric acid (HF). As mentioned above, the thickness of the stopping layer 235 is thinner, so that the etchant applied to the memory cell in the present embodiment is less than that in the prior art. In addition, the step of etching the oxide layer by etchant in the prior art is replaced by the CMP process, so that the damage caused by the etchant can be greatly reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a non-volatile memory cell, comprising:
   providing a substrate;
   forming a stacking structure on the substrate, the stacking structure at least comprising an oxide-nitride-oxide layer (ONO layer), a polysilicon layer thereon and a stopping layer on the polysilicon layer, wherein the stopping layer comprises super silicon rich oxide (SSRO);
   patterning the stacking structure to form a plurality of separated stacking units, each two stacking units having an aperture therebetween;
   forming a source region and a drain region buried in the substrate at two sides of the each stacking unit;
   forming an oxide layer in the aperture and over the stacking units; and
   performing a chemical mechanical polishing (CMP) process until the stopping layer is exposed to remove the oxide layer over the stacking units and outside the aperture, wherein the thickness of the stopping layer is less than 300 angstroms.

2. The method according to claim 1, wherein the CMP process is controlled by a real-time monitor.

3. The method according to claim 1, wherein the endpoint of the CMP process is detected by an in situ rate monitor (ISRM).

4. The method according to claim 1, wherein after the stopping layer is exposed when the CMP process is finished, the method further comprising:
   removing the stopping layer by an etchant after the CMP process.

5. The method according to claim 4, wherein the etchant for removing the super silicon rich oxide comprises hydrofluoric acid (HF).

6. The method according to claim 1, wherein a slurry, providing selectivity for the oxide layer to the stopping layer, is applied to the CMP process.

7. The method according to claim 6, wherein the slurry is a ceria ($CeO_2$) based slurry.

8. The method according to claim 1, wherein the CMP process further comprises:
   polishing the oxide layer with a first slurry until a surface of the oxide layer is substantially flattened; and
   polishing the oxide layer with a second slurry, providing selectivity for the oxide layer to the stopping layer.

9. The method according to claim 1, wherein the oxide layer comprises high density plasma oxide (HDP).

10. The method according to claim 1, wherein the first slurry is a silicon based slurry, and the second slurry is a ceria ($CeO_2$) based slurry.

11. The method according to claim 1, wherein the oxide layer remain in the aperture to be flush with the stacking structure after the CMP process.

* * * * *